(12) United States Patent
Baker et al.

(10) Patent No.: US 7,642,822 B2
(45) Date of Patent: Jan. 5, 2010

(54) ANALOG PHASE-LOCKED LOOP

(75) Inventors: Daniel G. Baker, Beaverton, OR (US);
Gilbert A. Hoffman, Aloha, OR (US);
Michael S. Overton, Beaverton, OR (US); Barry A. McKibben, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 12/061,905

(22) Filed: Apr. 3, 2008

(65) Prior Publication Data
US 2009/0251180 A1   Oct. 8, 2009

(51) Int. Cl.
*H03L 7/06* (2006.01)
(52) U.S. Cl. .......................... 327/156; 327/294; 331/49
(58) Field of Classification Search .................. None
See application file for complete search history.

(56) References Cited
U.S. PATENT DOCUMENTS

| | | | | |
|---|---|---|---|---|
| 5,414,741 A | * | 5/1995 | Johnson | 375/376 |
| 5,519,887 A | * | 5/1996 | Lieu | 455/266 |
| 6,175,281 B1 | * | 1/2001 | Mori | 331/17 |
| 6,538,499 B1 | * | 3/2003 | Lu | 327/557 |
| 6,657,464 B1 | * | 12/2003 | Balardeta et al. | 327/147 |
| 7,019,571 B2 | * | 3/2006 | Lim | 327/157 |
| 7,061,288 B2 | * | 6/2006 | Burgess | 327/156 |
| 7,136,441 B2 | * | 11/2006 | Iwata et al. | 375/355 |
| 7,436,229 B2 | * | 10/2008 | Sidiropoulos et al. | 327/157 |
| 2004/0263224 A1 | * | 12/2004 | Schrodinger | 327/156 |
| 2007/0103214 A1 | * | 5/2007 | Drexler et al. | 327/156 |

* cited by examiner

*Primary Examiner*—Cassandra Cox
(74) *Attorney, Agent, or Firm*—Kristine Matthews; Matthew D. Rabdau

(57) ABSTRACT

Aspects of the present invention are related, in general, to Type-III phase-locked loops. In particular, aspects of the present invention relate to analog Type-III phase-locked loop arrangements comprising at least two signal paths, wherein each signal path may correspond to a bandwidth partition and may be selected by a selector according to a bandwidth parameter value. According to one aspect of the present invention, a first signal path may correspond to a fast loop (wide closed-loop bandwidth), and a second signal path may correspond to a slow loop (narrow closed-loop bandwidth).

16 Claims, 6 Drawing Sheets

ANALOG PHASE-LOCKED LOOP

FIELD OF THE INVENTION

Embodiments of the present invention relate to phase-locked loops (PLLs) and more particularly relate to analog Type-III phase-locked loops.

BACKGROUND

A phase-locked loop (PLL) is a linear control system that operates by producing an oscillator frequency and phase to match those of a reference input signal. In the locked state, any change in the reference input signal first appears as a change in phase between the reference input signal and the oscillator frequency. This phase shift functions as an error signal to change the phase and frequency of the PLL oscillator. Phase-locked loops may be used in a wide range of applications and may realize a variety of functions. Exemplary functions for which PLLs may be used to accomplish include clock extraction, clock recovery, clock synchronization, carrier recovery, tracking filters, frequency synthesis, frequency and phase demodulation, phase modulation and numerous other functions.

A basic PLL may comprise a phase detector (PD), a voltage-controlled oscillator (VCO), a feedback interconnection and a loop filter. The phase detector is typically a non-linear device that, over a limited range, creates a linear output signal that corresponds to the phase difference between two periodic input signals: a reference signal and a feedback signal provided by a feedback interconnection. The voltage-controlled oscillator produces a periodic signal whose frequency is controlled by an input voltage with preferably a linear transfer function of voltage to frequency. Since frequency as function of time is the time-rate-of-change (time-derivative) of phase as a function of time, the phase of the VCO periodic output signal relative to a reference phase will be proportional to the time-integral of the input voltage. The constant of proportionality is the VCO gain with units of, for example, radians/volt-sec. In other words, the VCO accumulates phase (radians) proportional to the area (volts times seconds) under the voltage versus time input. Therefore, a PLL that contains a VCO rather than a simple phase modulator has at least one integrator in the control loop due to the VCO.

While the loop filter may be omitted, it is typically required in order for the PLL to function properly. In particular, it is needed when more than one integrator is used in the loop.

Two terms, type and order, may be used to describe a PLL. The type of a PLL system refers to the number of poles of the open-loop transfer function that are located at the origin. This also corresponds to the number of true integrators within the feedback loop. The order of a PLL system refers to the highest degree of the polynomial expression referred to as the characteristic equation.

In some applications, a Type-II phase-locked loop may be advantageous since the two integrators requisite for a Type-II classification effectuate removal of the static phase error for any frequency-offset. A Type-III phase-locked loop additionally removes any phase error for an input signal that is linearly changing with frequency over time.

In some applications, a Type-III phase-locked loop may be required to meet design and measurement specifications. In an exemplary application described in IEEE Standard 1521-20031, "IEEE Trial-Use Standard for Measurement of Video Jitter and Wander," which is hereby incorporated by reference herein in its entirety, a Type-III feedback control phase-locked loop is suggested for measuring jitter using an extracted clock to trigger an oscilloscope. In this application, at least one analog VCO is desired to provide the periodic signal to trigger the oscilloscope. Two phase-locked loops, one of Type-II and the other of Type-I, may be cascaded to provide the requisite Type-III response in the cited standard but this is expensive so a single PLL is preferred. The PLL may be a hybrid of analog and digital signal processing using DAC and/or ADC converters, but would have an output from the VCO to provide oscilloscope trigger with a Type-III phase tracking response.

A single, analog Type-III PLL is preferable over the higher cost and power consumption of the analog/digital hybrid or two cascaded phase-locked loops. However, Type-III phase-locked loops are often described in the literature as inherently unstable or impossible to realize. In fact, while the IEEE Standard 1521-20031 suggests the Type-III phase-locked loop for measuring jitter using an extracted clock to trigger an oscilloscope, this document does not describe or teach an analog, or hybrid digital/analog, Type-III phase-locked loop design, nor does it teach the use of the cascade of two phase-locked loops.

Other design specifications and standards (for example, SMPTE RP 192-2003, "PROPOSED SMPTE RECOMMENDED PRACTICE Jitter Measurement Procedures in Bit-Serial Digital Interfaces") also expect a Type-III phase-locked loop response. However these documents neither teach nor enable the Type-III phase-locked loop. In fact, many of the references specifically state the difficulty, often state the impossibility, of realizing a single, stable, analog Type-III phase-locked loop. Typically these references further suggest less difficult to implement alternatives to the preferred Type-III loop, for example, a Type-II phase-locked loop.

A single, stable, realizable, analog Type-III phase-locked loop is desirable.

SUMMARY

Some embodiments of the present invention comprise methods and systems for analog Type-III phase-locked loop arrangements comprising at least two signal paths, wherein each signal path may correspond to a bandwidth partition. In some embodiments of the present invention, a first signal path may correspond to a fast loop (wide closed-loop bandwidth), and a second signal path may correspond to a slow loop (narrow closed-loop bandwidth).

Some embodiments of the present invention comprise methods and systems for analog Type-III phase-locked loop arrangements comprising a first integrator coupled with a second integrator coupled with a voltage-controlled oscillator, thereby effectuating three integrators, wherein the phase margin of the arrangement at unity gain is positive. In some embodiments of the present invention, a positive phase margin at unity gain may be realized with two zeros active at unity gain in the phase-locked loop arrangement.

Some embodiments of the present invention comprise methods and systems for providing a triggering signal wherein the triggering signal may be based on an extracted clock signal obtained using an analog Type-III phase-locked loop arrangement.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

Figure 6:
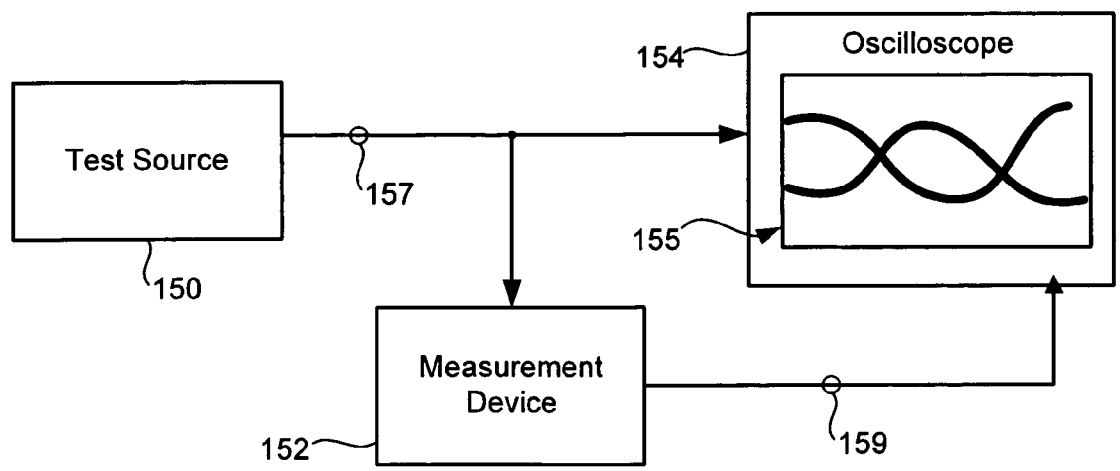
Figure 7:
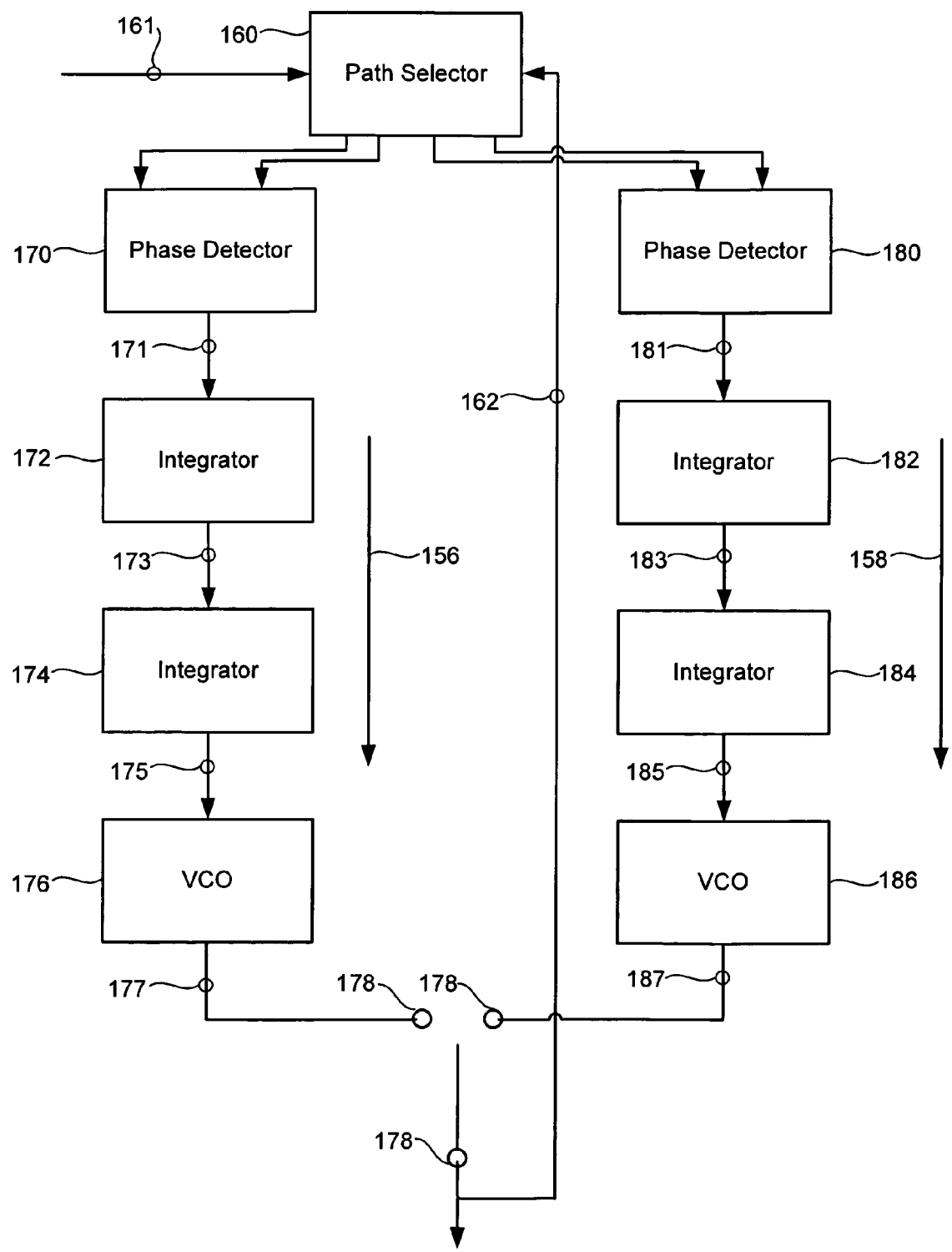

FIG. 6 is a diagram showing exemplary embodiments of the present invention comprising triggering an oscilloscope with a sync-locked signal recovered using an analog Type-III phase-locked loop according to embodiments of the present invention; and FIG. 7 is a diagram showing exemplary embodiments of the present invention comprising an analog Type-III phase-locked loop arrangement, wherein the Type-III phase-locked loop arrangement comprises at least two signal paths, wherein each signal path comprises a phase detector.

DETAILED DESCRIPTION OF EXEMPLARY EMBODIMENTS

Embodiments of the present invention will be best understood by reference to the drawings, wherein like parts are designated by like numerals throughout. The figures listed above are expressly incorporated as part of this detailed description.

It will be readily understood that the components of the present invention, as generally described and illustrated in the figures herein, could be arranged and designed in a wide variety of different configurations. Thus, the following more detailed description of the embodiments of the methods and systems of the present invention is not intended to limit the scope of the invention but it is merely representative of the presently preferred embodiments of the invention.

Elements of embodiments of the present invention may be embodied in hardware, firmware and/or software. While exemplary embodiments revealed herein may only describe one of these forms, it is to be understood that one skilled in the art would be able to effectuate these elements in any of these forms while resting within the scope of the present invention.

Analog Type-III phase-locked loops have long been considered inherently unstable and difficult, if not impossible, to realize. Christian Münker states in *Phase Noise and Spurious Sidebands in Frequency Synthesizers* v3.2, February 2005, "and there is no such thing as a Type III PLL because systems with more than two poles at the origin (=integrator) are always unstable." A primary reason for this misconception is the long-held misunderstanding that the Type-III phase-locked loop is necessarily unstable based on the accumulated phase contributions of 180 degrees due to feedback loop, 90 degrees due to the first integrator, 90 degrees due to the second integrator and 90 degrees due to the third integrator (typically a voltage-controlled oscillator). These phase contributions are widely held to guarantee loop instability in a Type-III phase-locked loop.

However, some embodiments of the present invention comprise stable, analog Type-III phase-locked loop arrangements wherein a positive phase margin is maintained at open-loop unity gain which allows the embodiments of the present invention to behave in a stable fashion. In some embodiments of the present invention, a positive phase margin at unity gain may be realized with two zeros active at unity gain in the phase-locked loop arrangement.

Some embodiments of the present invention comprise stable, analog Type-III phase-locked loop arrangements comprising multiple signal paths based on bandwidth, thereby alleviating the necessity of parameter adjustment within a single loop since the needed range of the parametric values may not be realizable with typical analog components.

Figure 1:
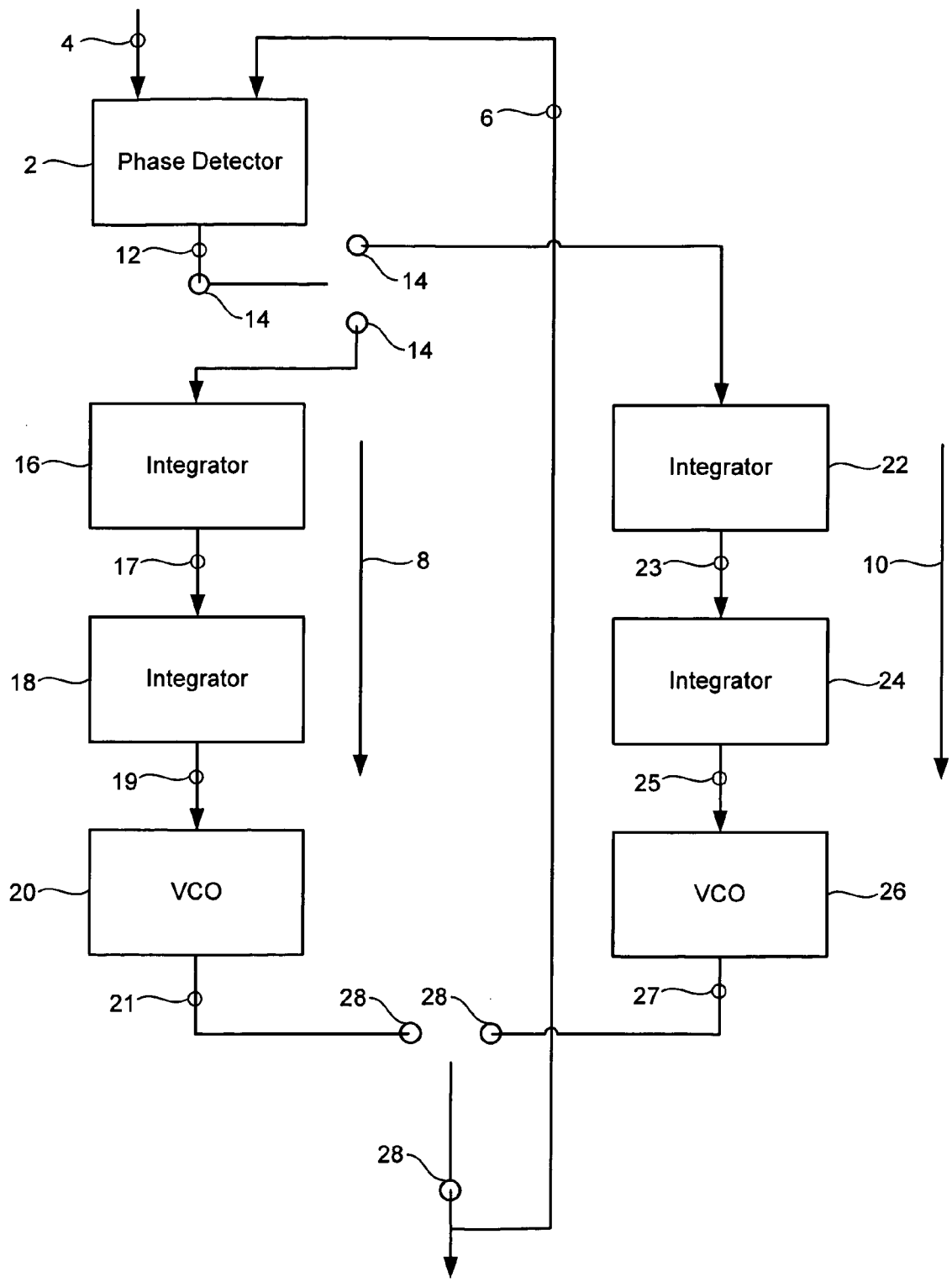
FIG. 1 is a diagram showing exemplary embodiments of the present invention comprising an analog Type-III phase-locked loop arrangement, wherein the Type-III phase-locked loop arrangement comprises at least two signal paths.

Some embodiments of the present invention may be described in relation to FIG. 1. In these embodiments, an analog Type-III phase-locked loop arrangement comprises a phase detector 2, which may receive as input a reference signal 4 and a feedback signal 6, and two signal paths: a first signal path 8 and a second signal path 10. The phase detector 2 may generate an error signal 12 that is representative of the phase difference between the input reference signal 4 and the feedback signal 6. The error signal 12 may be switched between the signal paths 8, 10 according to a selection mechanism 14. In some embodiments of the present invention, the selection mechanism 14 may be based on a bandwidth selector.

The first signal path 8 may comprise a first integrator 16, which may be referred to as a first first-signal-path integrator 16, a second integrator 18, with may be referred to as a second first-signal-path integrator 18, and a voltage-controlled oscillator 20, which may be referred to as a first-signal-path voltage-controlled oscillator 20. When the first signal path 8 is selected via the selection mechanism 14, the error signal 12 may be connected to the input of the first first-signal-path integrator 16 which may produce, in response to the input error signal 12, a first-signal-path integrated signal 17. The second first-signal-path integrator 18 may produce, in response to the first-signal-path integrated signal 17, a first-signal-path error-voltage signal 19. The first-signal-path error-voltage signal 19 may comprise the control voltage signal for the first-signal-path voltage-controlled oscillator 20. The first-signal-path voltage-controlled oscillator 20 may produce a first-signal-path output periodic signal 21. In these embodiments of the present invention, the first first-signal-path integrator 16 and the second first-signal-path integrator 18 may be designed to provide positive phase margin at unity gain. In some embodiments of the present invention, a positive phase margin at unity gain may be realized with two zeros active at unity gain in the phase-locked loop arrangement.

The second signal path 10 may comprise a first integrator 22, which may be referred to as a first second-signal-path integrator 22, a second integrator 24, which may be referred to as a second second-signal-path integrator 24, and a voltage-controlled oscillator 26, which may be referred to as a second-signal-path voltage-controlled oscillator 26. When the second signal path 10 is selected via the selection mechanism 14, the error signal 12 may be connected to the input of the first second-signal-path integrator 22 which may produce, in response to the input error signal 12, a second-signal-path integrated signal 23. The second second-signal-path integrator 24 may produce, in response to the second-signal-path integrated signal 23, a second-signal-path error-voltage signal 25. The second-signal-path error-voltage signal 25 may comprise the control voltage signal for the second-signal-path voltage-controlled oscillator 26. The second-signal-path voltage-controlled oscillator 26 may produce a second-signal-path output periodic signal 27. In these embodiments of the present invention, the first second-signal-path integrator 22 and the second second-signal-path integrator 24 may be designed to provide positive phase margin at unity gain. In some embodiments of the present invention, a positive phase margin at unity gain may be realized with two zeros active at unity gain in the phase-locked loop arrangement.

The feedback signal 6 of the Type-III phase-locked loop arrangement may be selected according to a selection mechanism 28 from the first-signal-path output periodic signal 21 and the second-signal-path output periodic signal 27. In some embodiments of the present invention, the selection mechanism 28 may be based on a bandwidth selector.

In some embodiments of the present invention, the first signal path 8 may correspond to a fast loop, and the second signal path 10 may correspond to a slow loop, wherein the unity-gain crossover frequency corresponding to the fast path may be significantly greater than the unity-gain crossover frequency corresponding to the slow path. In some embodiments, the fast loop may have a unity-gain crossover frequency near 100 KHz, and the slow loop may have a unity-gain crossover frequency near 10 Hz. In some embodiments of the present invention, the unity-gain crossover frequency of the first signal path and the unity-gain crossover frequency of the second signal path may be related to a demarcation frequency that separates a jitter region and a wander region. In alternative embodiments of the present invention, the unity-gain crossover frequency of the first signal path may be related to a first demarcation frequency, and the unity-gain crossover frequency of the second signal path may be related to a second demarcation frequency.

In some embodiments of the present invention according to FIG. 1, the low-speed loop may not respond to, or follow, jitter frequencies above a first demarcation frequency. The output of the low-speed loop may be quiet at frequencies above the first demarcation frequency. Therefore, the VCO jitter for this loop is also quiet above the first demarcation frequency. Since the VCO jitter may be quiet above the first demarcation frequency, an oscilloscope may show the jitter on the input reference signal that is above the first demarcation frequency.

Similarly, the high-speed loop may not respond to, or follow, jitter frequencies above a second demarcation frequency. The output of the high-speed loop may be quiet at frequencies above the second demarcation frequency. Therefore, the VCO jitter for the high speed loop is also quiet above the second demarcation frequency. Since the VCO jitter may be quiet above the second demarcation frequency, an oscilloscope may show the jitter on the input reference signal that is above the second demarcation frequency. The second demarcation frequency (the demarcation frequency associated with the high-speed loop) is higher than the first demarcation frequency (the demarcation frequency associated with the low-speed loop).

In some embodiments of the present invention, the first signal path 8 may be a fast loop with a wideband VCO. The wideband VCO may create a large change in frequency and phase with a small change in control or error voltage 19. This is often referred to as the VCO gain. Additionally a wideband VCO may continue to maintain that gain over a wide bandwidth of control voltage frequencies. In some embodiments of the present invention, components in the integrators may be matched to the wideband VCO to effect a clock recovery bandwidth near 100 KHz.

In some embodiments of the present invention, the second signal path 10 may be a slow loop with a narrowband VCO. The narrowband VCO may create a small change in frequency with a large change in control or error voltage 25. In some embodiments of the present invention, by matching the integrator components to the narrowband VCO, a clock recovery bandwidth near 10 Hz may be realized.

The benefit of having two (or more) independent signal paths and VCOs is based on the fact that it would be difficult if not impossible to put a narrowband VCO in a wideband loop and visa-versa In alternative embodiments of the present invention, a Type-III phase-locked loop arrangement may comprise more than two signal paths, wherein each path may correspond to a bandwidth partition.

Figure 2:
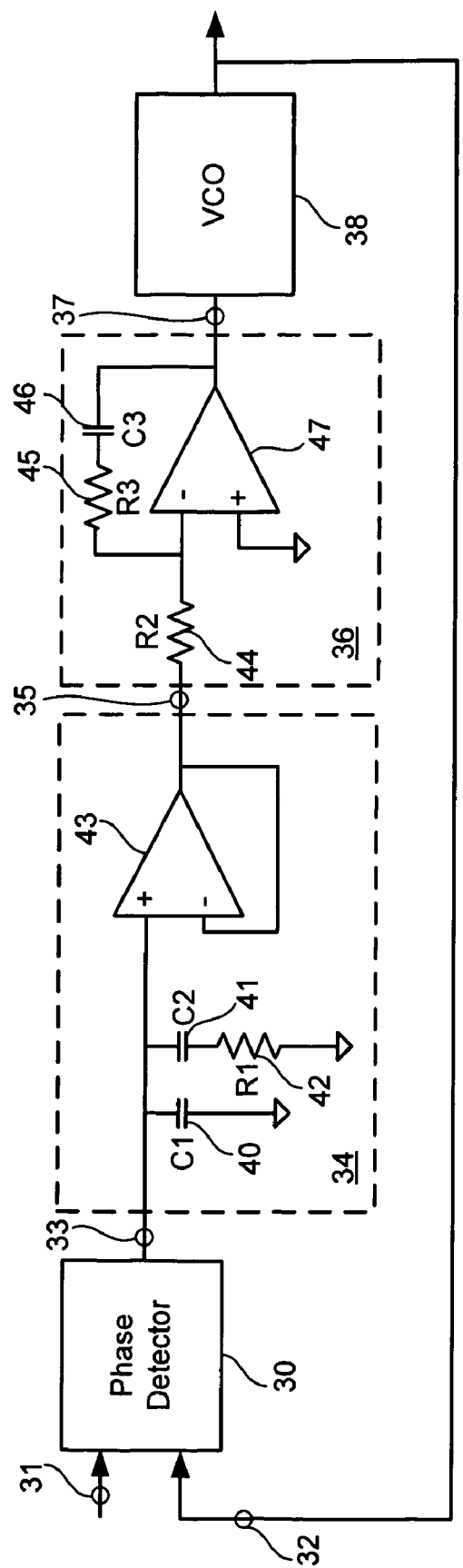
FIG. 2 is a diagram showing exemplary embodiments of the present invention comprising a current-out phase detector.

Some embodiments of the present invention may be described in relation to FIG. 2. In these embodiments, an analog Type-III phase-locked loop arrangement comprises a phase detector 30 which may receive as input a reference signal 31 and a feedback signal 32, and two integrators: a first integrator 34 and a second integrator 36. The phase detector 30 may generate an error signal 33 that is representative of the phase difference between the input reference signal 31 and the feedback signal 32. In exemplary embodiments, the phase detector 30 may comprise a current-out phase-detector. In these exemplary embodiments, the first integrator 34 may comprise two capacitors 40, 41, denoted C1 and C2, a resistor 42, denoted R1, and an operational amplifier 43 arranged according to FIG. 2. The second integrator 36 may be responsive to the integrated signal 35 output from the first integrator 34. The second integrator 36 may comprise two resistors 44, 45, denoted R2 and R3, a capacitor 46, denoted C3, and an operational amplifier 47 arranged according to FIG. 2. A voltage-controlled oscillator 38 may be responsive to an error voltage 37 generated by the second integrator 36, and the voltage-controlled oscillator 38 may generate a periodic signal 32 which may be fed back into the phase detector 30.

In some embodiments of the present invention, the feedback path from the voltage-controlled oscillator 38 may comprise a divider chain. In these embodiments, the VCO 38 gain may be given as the product of the oscillator gain and divider ratios.

In one exemplary embodiment of the present invention described in relation to FIG. 2, the phase detector 30 may have a gain of 783 µA/rad, the voltage-controlled oscillator 38 may be a narrow-range voltage-controlled oscillator with a VCO gain of 32 (rad/s)/volt, which includes divider ratios, and the capacitor and resistor values may be set according to:

$C1$=0.05 µF;
$C2$=1 µF;
$R1$=60 kΩ;
$R2$=1 MΩ;
$R3$=60 kΩ; and
$C3$=1 µF.

In another exemplary embodiment of the present invention described in relation to FIG. 2, the phase detector 30 may have a gain of 783 µA/rad, the voltage-controlled oscillator 38 may be a narrow-range voltage-controlled oscillator with a VCO gain of 32 (rad/s)/volt, which includes divider ratios, and the capacitor and resistor values may be set according to:

$C1$=0.047 µF;
$C2$=1 µF;
$R1$=61.9 kΩ;
$R2$=1 MΩ;
$R3$=61.9 kΩ; and
$C3$=1 µF.

In another exemplary embodiment of the present invention described in relation to FIG. 2, the phase detector 30 may have a gain of 783 μA/rad, the voltage-controlled oscillator 38 may be a wide-range voltage-controlled oscillator with a VCO gain of 1,970,000 (rad/s)/volt, which includes divider ratios, and the capacitor and resistor values may be set according to:

C1=47 pF;
C2=0.001 μF;
R1=3.92 kΩ;
R2=200 kΩ;
R3=39.2 kΩ; and
C3=100 pF.

In another exemplary embodiment of the present invention described in relation to FIG. 2, the capacitor and resistor values may be set to provide positive phase margin at unity gain. In some embodiments of the present invention, a positive phase margin at unity gain may be realized with two zeros active at unity gain in the phase-locked loop arrangement.

Figure 3:
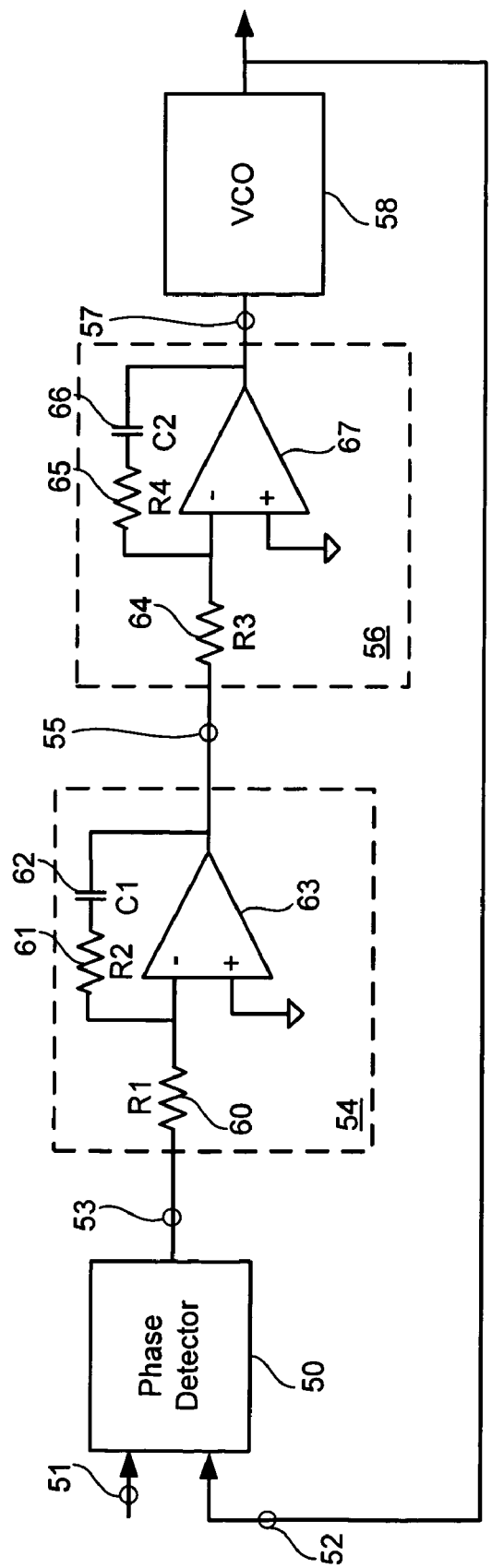
FIG. 3 is a diagram showing exemplary embodiments of the present invention comprising a voltage-out phase detector.

Alternative embodiments of the present invention may be described in relation to FIG. 3. In these embodiments, an analog Type-III phase-locked loop arrangement comprises a phase detector 50 which may receive as input a reference signal 51 and a feedback signal 52, and two integrators: a first integrator 54 and a second integrator 56. The phase detector 50 may generate an error signal 53 that is representative of the phase difference between the input reference signal 51 and the feedback signal 52. In exemplary embodiments, the phase detector 50 may comprise a voltage-out phase-detector. In these exemplary embodiments, the first integrator 54 may comprise two resistors 60, 61, denoted R1 and R2, a capacitor 62, denoted C1, and an operational amplifier 63 arranged according to FIG. 3. The second integrator 56 may be responsive to the integrated signal 55 output from the first integrator 54. The second integrator may comprise two resistors 64, 65, denoted R3 and R4, a capacitor 66, denoted C2, and an operational amplifier 67 arranged according to FIG. 3. A voltage-controlled oscillator 58 may be responsive to an error voltage 57 generated by the second integrator 56, and the voltage-controlled oscillator 58 may generate a periodic signal 52 which may be fed back into the phase detector 50.

In an exemplary embodiment of the present invention described in relation to FIG. 3, the capacitor and resistor values may be set to provide positive phase margin at unity gain. In some embodiments of the present invention, a positive phase margin at unity gain may be realized with two zeros active at unity gain in the phase-locked loop arrangement.

Figure 4:
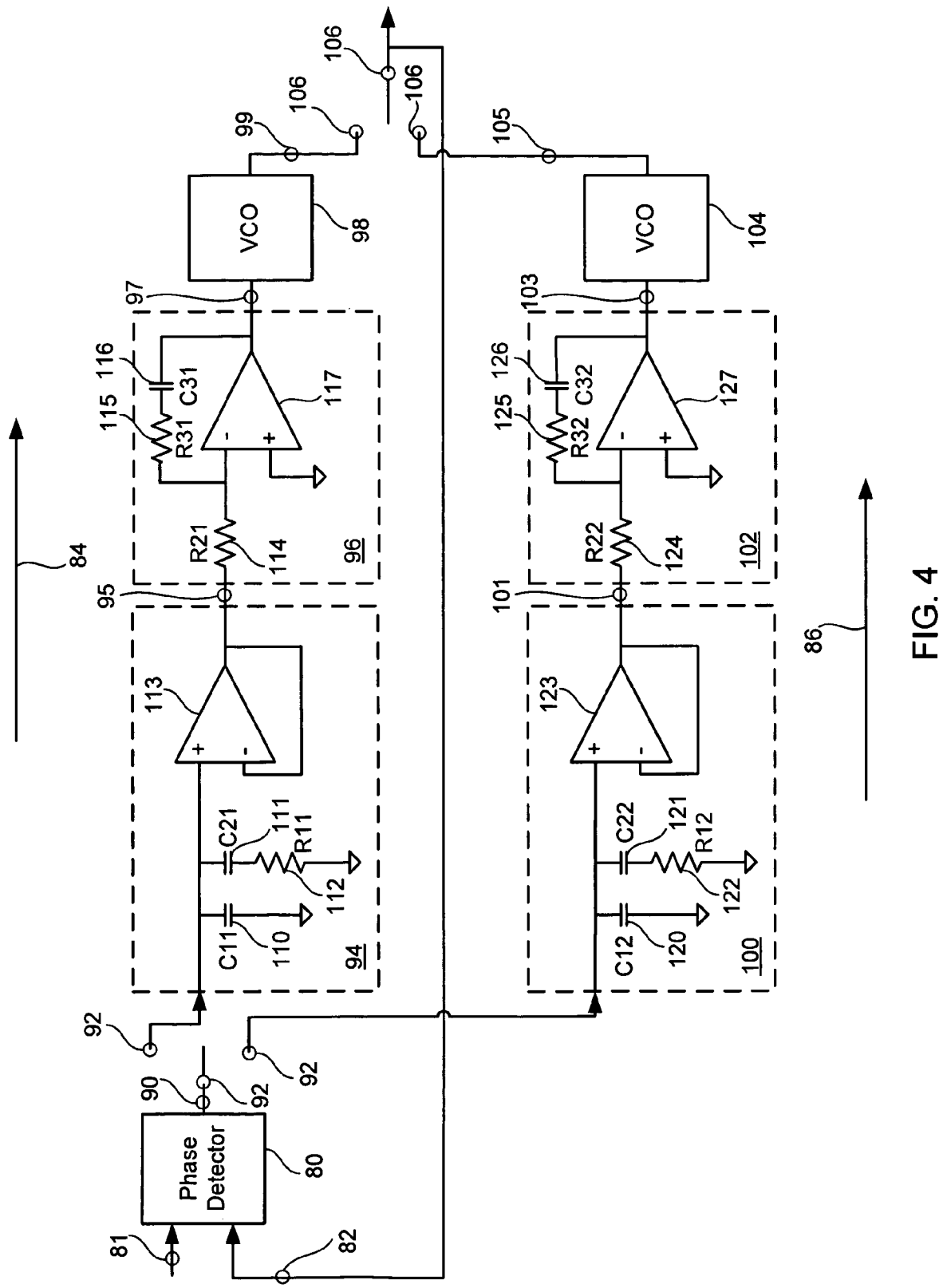
FIG. 4 is a diagram showing exemplary embodiments of the present invention comprising a two path Type-III phase-locked loop arrangement.

Some embodiments of the present invention may be described in relation to FIG. 4. In these embodiments, an analog Type-III phase-locked loop arrangement comprises a phase detector 80, which may receive as input a reference signal 81 and a feedback signal 82, and two signal paths: a first signal path 84 and a second signal path 86. The phase detector 80 may generate an error signal 90 that is representative of the phase difference between the input reference signal 81 and the feedback signal 82. The error signal 90 may be switched between the signal paths 84, 86 according to a selection mechanism 92. In some embodiments of the present invention, the selection mechanism 92 may be based on a bandwidth selector.

The first signal path 84 may comprise a first integrator 94, which may be referred to as a first first-signal-path integrator 94, a second integrator 96, with may be referred to as a second first-signal-path integrator 96, and a voltage-controlled oscillator 98, which may be referred to as a first-signal-path voltage-controlled oscillator 98. When the first signal path 84 is selected via the selection mechanism 92, the error signal 90 may be connected to the input of the first first-signal-path integrator 94 which may produce, in response to the input error signal 90, a first-signal-path integrated signal 95. The second first-signal-path integrator 96 may produce, in response to the first-signal-path integrated signal 95, a first-signal-path error-voltage signal 97. The first-signal-path error-voltage signal 97 may comprise the control voltage signal for the first-signal-path voltage-controlled oscillator 98. The first-signal-path voltage-controlled oscillator 98 may produce a first-signal-path output periodic signal 99. In some embodiments of the present invention the first first-signal-path integrator 94 and the second first-signal-path integrator 96 may be designed to provide positive phase margin at unity gain in the first signal path. In some embodiments of the present invention, a positive phase margin at unity gain may be realized with two zeros active at unity gain in the phase-locked loop arrangement.

The second signal path 86 may comprise a first integrator 100, which may be referred to as a first second-signal-path integrator 100, a second integrator 102, which may be referred to as a second second-signal-path integrator 102, and a voltage-controlled oscillator 104, which may be referred to as a second-signal-path voltage-controlled oscillator 104. When the second signal path 86 is selected via the selection mechanism 92, the error signal 90 may be connected to the input of the first second-signal-path integrator 100 which may produce, in response to the input error signal 90, a second-signal-path integrated signal 101. The second second-signal-path integrator 102 may produce, in response to the second-signal-path integrated signal 101, a second-signal-path error-voltage signal 103. The second-signal-path error-voltage signal 103 may comprise the control voltage signal for the second-signal-path voltage-controlled oscillator 104. The second-signal-path voltage-controlled oscillator 104 may produce a second-signal-path output periodic signal 105. In some embodiments of the present invention the first second-signal-path integrator 100 and the second second-signal-path integrator 102 may be designed to provide positive phase margin at unity gain in the second signal path. In some embodiments of the present invention, a positive phase margin at unity gain may be realized with two zeros active at unity gain in the phase-locked loop arrangement.

The feedback signal 82 of the Type-III phase-locked loop arrangement may be selected according to a selection mechanism 106 from the first-signal-path output periodic signal 99 and the second-signal-path output periodic signal 104. In some embodiments of the present invention, the selection mechanism 106 may be based on a bandwidth selector.

In exemplary embodiments of the present invention described in relation to FIG. 4, the phase detector 80 may comprise a current-out phase-detector. In these exemplary embodiments, the first first-signal-path integrator 94 may comprise two capacitors 110, 111, denoted C11 and C21, a resistor 112, denoted R11, and an operational amplifier 113 arranged according to FIG. 4. The second first-signal-path integrator 96 may be responsive to the integrated signal 95 output from the first first-signal-path integrator 94. The second first-signal-path integrator 96 may comprise two resistors 114, 115, denoted R21 and R31, a capacitor 116, denoted C31, and an operational amplifier 117 arranged according to FIG. 4.

In exemplary embodiments of the present invention described in relation to FIG. 4, the phase detector 80 may comprise a current-out phase-detector. In these exemplary embodiments, the first second-signal-path integrator 100 may comprise two capacitors 120, 121, denoted C12 and C22, a resistor 122, denoted R12, and an operational amplifier 123 arranged according to FIG. 4. The second second-signal-path integrator 102 may be responsive to the integrated signal 101 output from the first second-signal-path integrator 100. The second second-signal-path integrator 102 may comprise two resistors 124, 125, denoted R22 and R32, a capacitor 126, denoted C32, and an operational amplifier 127 arranged according to FIG. 4.

In some embodiments of the present invention described in relation to FIG. 4, the first signal path 84 may correspond to a fast loop, and the second signal path 86 may correspond to a slow loop, wherein the unity-gain crossover frequency corresponding to the fast path may be significantly greater than the unity-gain crossover frequency corresponding to the slow path. In some embodiments, the fast loop may have a unity-gain crossover frequency near 100 KHz, and the slow loop may have a unity-gain crossover frequency near 10 Hz. In some embodiments of the present invention, the unity-gain crossover frequency of the first signal path and the unity-gain crossover frequency of the second signal path may be related to a demarcation frequency that separates a jitter region and a wander region. In alternative embodiments of the present invention, the unity-gain crossover frequency of the first signal path may be related to a first demarcation frequency, and the unity-gain crossover frequency of the second signal path may be related to a second demarcation frequency.

In an exemplary embodiment of the present invention described in relation to FIG. 4, the second-signal-path voltage-controlled oscillator 104 may be a narrow-range voltage-controlled oscillator with a VCO gain of 32 (rad/s)/volt, which includes divider ratios, and the capacitor and resistor values in the second signal path 86 may be set according to:

$C12=0.047$ μF;
$C22=1$ μF;
$R12=61.9$ kΩ;
$R22=1$ MΩ;
$R32=61.9$ kΩ;
$C32=1$ μF; and the first-signal-path voltage-controlled oscillator 98 may be a wide-range voltage-controlled oscillator with a VCO gain of 1,970,000 (rad/s)/volt, which includes divider ratios, and the capacitor and resistor values in the first signal path 84 may be set according to:

$C11=47$ pF;
$C21=0.001$ μF;
$R11=3.92$ kΩ;
$R21=200$ kΩ;
$R31=39.2$ kΩ; and
$C32=100$ pF.

In this exemplary embodiment, the phase detector 80 gain may be 783 μA/rad.

Figure 5:
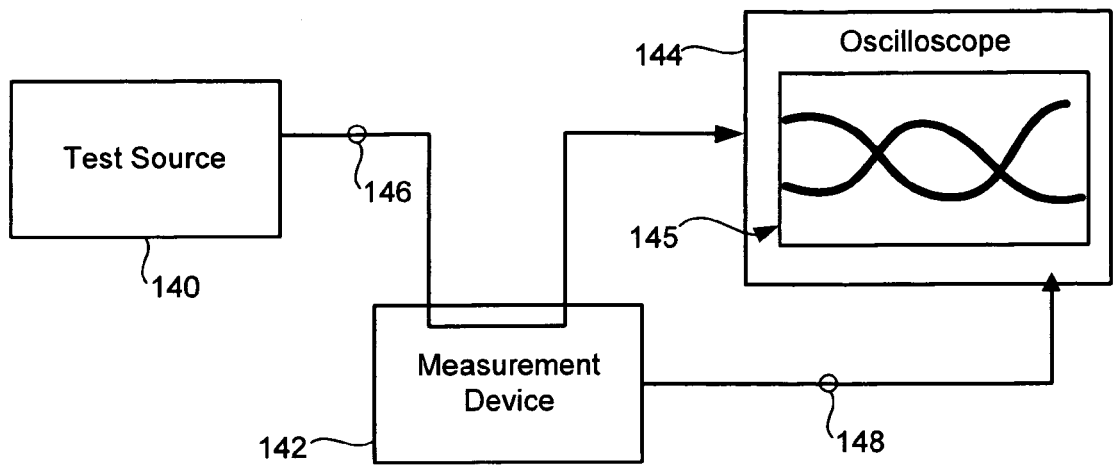
FIG. 5 is a diagram showing exemplary embodiments of the present invention comprising triggering an oscilloscope with a sync-locked signal recovered using an analog Type-III phase-locked loop according to embodiments of the present invention and a loop-through input signal path.

Some embodiments of the present invention may be described in relation to FIG. 5. In these embodiments, a signal source 140 may be under examination. The signal source 140 may generate a signal 146 which may loop through a measurement device 142, also considered measurement instrument, in addition to providing a signal input to an oscilloscope 144 which may comprise a display 145. In some embodiments of the present invention, the loop-through path in the measurement device 142 may be an active loop through. In alternative embodiments of the present invention, the loop-through path in the measurement device 142 may be a passive loop through. The measurement device 142 may comprise an analog Type-III phase-locked loop according to previously described embodiments of the present invention, which may lock to the input signal 146, thereby producing an output signal 148 which may be made available from the measurement device 142 and used as a trigger signal for the oscilloscope 144. In some embodiments of the present invention, the output signal 148 may be made available from the rear panel of the measurement instrument 142.

In some embodiments of the present invention, the signal source 140 may comprise a video source, and the generated signal 146 may comprise a jittery clock signal which may provide input to be displayed on the display 145 of the oscilloscope 144. In some embodiments of the present invention, an "eye" diagram may be displayed on the oscilloscope 144 display 145. The vertical axis of the "eye" diagram may display the input data 146, and the horizontal axis of the "eye" diagram may be a linear sweep signal triggered from the extracted clock signal 148.

Some embodiments of the present invention may be described in relation to FIG. 6. In these embodiments, a signal source 150 may be under examination. The signal source 150 may generate a signal 157 which may be distributed independently to a measurement device 152, also considered measurement instrument, and an oscilloscope 154 which may comprise a display 155. In some embodiments of the present invention a distribution amplifier (not shown) may be used in the independent distribution of the signal 157. The measurement device 152 may comprise an analog Type-III phase-locked loop according to previously described embodiments of the present invention, which may lock to the input signal 157, thereby producing an output signal 159 which may be made available from the measurement device 152 and used as a trigger signal for the oscilloscope 154. In some embodiments of the present invention, the output signal 159 may be made available from the rear panel of the measurement instrument 152.

In some embodiments of the present invention, the signal source 150 may comprise a video source, and the generated signal 157 may comprise a jittery clock signal which may provide input to be displayed on the display 155 of the oscilloscope 154. In some embodiments of the present invention, an "eye" diagram may be displayed on the oscilloscope 154 display 155. The vertical axis of the "eye" diagram may display the input data signal 157, and the horizontal axis of the "eye" diagram may be a linear sweep signal triggered from the extracted clock signal 159.

Some embodiments of the present invention may be described in relation to FIG. 7. In these embodiments, an analog Type-III phase-locked loop arrangement comprises a path selector 160 which selects between two signal paths: a first signal path 156 and a second signal path 158. An input reference signal 161 and a feedback signal 162 may be passed to the selected path. In some embodiments of the present invention, the path selection may be based on a bandwidth parameter.

The first signal path 156 may comprise a phase detector 170, which may be referred to as the first-signal-path phase detector 170, a first integrator 172, which may be referred to as a first first-signal-path integrator 172, a second integrator 174, with may be referred to as a second first-signal-path integrator 174, and a voltage-controlled oscillator 176, which may be referred to as a first-signal-path voltage-controlled oscillator 176. When the first signal path 156 is selected via the selection mechanism 160, the input reference signal 161 and the feedback signal 162 may be applied to the first-signal-path phase detector 170. The first-signal-path phase detector 170 may generate an error signal 171 that is representative of the phase difference between the input reference signal 161 and the feedback signal 162. The error signal 171 may be connected to the input of the first first-signal-path integrator 172 which may produce, in response to the input error signal 171, a first-signal-path integrated signal 173. The second first-signal-path integrator 174 may produce, in response to the first-signal-path integrated signal 173, a first-signal-path error-voltage signal 175. The first-signal-path error-voltage signal 175 may comprise the control voltage signal for the first-signal-path voltage-controlled oscillator 176. The first-signal-path voltage-controlled oscillator 176 may produce a first-signal-path output periodic signal 177. In some embodiments of the present invention the first first-signal-path integrator 172 and the second first-signal-path integrator 174 may be designed to provide positive phase margin at unity gain in the first signal path. In some embodiments of the present invention, a positive phase margin at unity gain may be realized with two zeros active at unity gain in the phase-locked loop arrangement.

The second signal path 158 may comprise a phase detector 180, which may be referred to as the second-signal-path phase detector 180, a first integrator 182, which may be referred to as a first second-signal-path integrator 182, a second integrator 184, with may be referred to as a second second-signal-path integrator 184, and a voltage-controlled oscillator 186, which may be referred to as a second-signal-path voltage-controlled oscillator 186. When the second signal path 158 is selected via the selection mechanism 160, the input reference signal 161 and the feedback signal 162 may be applied to the second-signal-path phase detector 180. The second-signal-path phase detector 180 may generate an error signal 181 that is representative of the phase difference between the input reference signal 161 and the feedback signal 162. The error signal 181 may be connected to the input of the first second-signal-path integrator 182 which may produce, in response to the input error signal 181, a second-signal-path integrated signal 183. The second second-signal-path integrator 184 may produce, in response to the second-signal-path integrated signal 183, a second-signal-path error-voltage signal 185. The second-signal-path error-voltage signal 185 may comprise the control voltage signal for the second-signal-path voltage-controlled oscillator 186. The second-signal-path voltage-controlled oscillator 186 may produce a second-signal-path output periodic signal 187. In some embodiments of the present invention the first second-signal-path integrator 182 and the second second-signal-path integrator 184 may be designed to provide positive phase margin at unity gain in the second signal path. In some embodiments of the present invention, a positive phase margin at unity gain may be realized with two zeros active at unity gain in the phase-locked loop arrangement.

The feedback signal 162 of the Type-III phase-locked loop arrangement may be selected according to a selection mechanism 178 from the first-signal-path output periodic signal 177 and the second-signal-path output periodic signal 187. In some embodiments of the present invention, the selection mechanism 178 may be based on a bandwidth selector.

In some embodiments of the present invention, the first signal path 156 may correspond to a fast loop, and the second signal path 158 may correspond to a slow loop, wherein the unity-gain crossover frequency corresponding to the fast path may be significantly greater than the unity-gain crossover frequency corresponding to the slow path. In some embodiments, the fast loop may have a unity-gain crossover frequency near 100 KHz, and the slow loop may have a unity-gain crossover frequency near 10 Hz. In some embodiments of the present invention, the unity-gain crossover frequency of the first signal path and the unity-gain crossover frequency of the second signal path may be related to a demarcation frequency that separates a jitter region and a wander region. In alternative embodiments of the present invention, the unity-gain crossover frequency of the first signal path may be related to a first demarcation frequency, and the unity-gain crossover frequency of the second signal path may be related to a second demarcation frequency.

In alternative embodiments of the present invention, an analog Type-III phase-locked loop arrangement may comprise more than two signal paths, wherein each path may correspond to a bandwidth partition.

The terms and expressions which have been employed in the foregoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. An analog phase-locked loop arrangement, said analog phase-locked loop arrangement comprising:
   a) a phase detector for providing an error signal representative of the difference in phase between an input reference signal and an output signal of said analog phase-locked loop arrangement;
   b) a first selector for establishing a connection between said error signal and a first signal path when a first bandwidth parameter value is selected and for establishing a connection between said error signal and a second signal path when a second bandwidth parameter value is selected, wherein:
      i) said first signal path comprises:
         (1) a first first-signal-path integrator for integrating said error signal, thereby producing a first-signal-path integrated signal;
         (2) a second first-signal-path integrator for integrating said first-signal-path integrated signal, thereby producing a first-signal-path error-voltage signal; and
         (3) a first-signal-path voltage-controlled oscillator responsive to said first-signal-path error-voltage signal, thereby producing a first-signal-path output signal; and
      ii) said second signal path comprises:
         (1) a first second-signal-path integrator for integrating said error signal, thereby producing a second-signal-path integrated signal;
         (2) a second second-signal-path integrator for integrating said second-signal-path integrated signal, thereby producing a second-signal-path error-voltage signal; and
         (3) a second-signal-path voltage-controlled oscillator responsive to said second-signal-path error-voltage signal, thereby producing a second-signal-path output signal;
   c) a second selector for selecting said first-signal-path output signal as said output signal when said first bandwidth parameter value is selected and for selecting said second-signal-path output signal as said output signal when said second bandwidth parameter value is selected; and
   d) a feedback connection connecting said output signal to said phase detector.

2. An analog phase-locked loop arrangement as described in claim 1, wherein said input reference signal is a clock signal comprising a jitter component and a wander component.

3. An analog phase-locked loop arrangement as described in claim 1, wherein:
   a) said first-signal-path voltage-controlled oscillator comprises a wide-range voltage-controlled oscillator; and b) said second-signal-path voltage-controlled oscillator comprises a narrow-range voltage-controlled oscillator.

4. An analog phase-locked loop arrangement as described in claim 1, wherein:
a) said first signal path is associated with a first plurality of frequencies, wherein each frequency in said first plurality of frequencies is less than a first demarcation frequency; and
b) said second signal path is associated with a second plurality of frequencies, wherein each frequency in said second plurality of frequencies is less than a second demarcation frequency.

5. An analog phase-locked loop arrangement as described in claim 1, wherein:
a) said first first-signal-path integrator and said second first-signal-path integrator provide a positive phase margin at unity gain for said first signal path; and
b) said first second-signal-path integrator and said second second-signal-path integrator provide a positive phase margin at unity gain for said second signal path.

6. A system for providing a time reference to a measurement device for an eye diagram, said system comprising:
a) an analog phase-locked loop arrangement, said analog phase-locked loop arrangement comprising:
i) a phase detector for providing an error signal representative of the difference in phase between an input reference signal and an output signal of said analog phase-locked loop arrangement;
ii) a first selector for establishing a connection between said error signal and a fast-loop signal path when a first bandwidth parameter value is selected and for establishing a connection between said error signal and a slow-loop signal path when a second bandwidth parameter value is selected, wherein:
 (1) said fast-loop signal path comprises:
  (a) a first fast-loop-path integrator for integrating said error signal, thereby producing a fast-loop-path integrated signal;
  (b) a second fast-loop-path integrator for integrating said fast-loop-path integrated signal, thereby producing a fast-loop-path error-voltage signal; and
  (c) a fast-loop-path voltage-controlled oscillator responsive to said fast-loop-path error-voltage signal, thereby producing a fast-loop output signal; and
 (2) said slow-loop signal path comprises:
  (a) a first slow-loop-path integrator for integrating said error signal, thereby producing a slow-loop-path integrated signal;
  (b) a second slow-loop-path integrator for integrating said slow-loop-path integrated signal, thereby producing a slow-loop-path error-voltage signal; and
  (c) a slow-loop-path voltage-controlled oscillator responsive to said slow-loop-path error-voltage signal, thereby producing a slow-loop output signal;
iii) a second selector for selecting said fast-loop output signal as said output signal when said first bandwidth parameter value is selected and for selecting said slow-loop output signal as said output signal when said second bandwidth parameter is selected; and
iv) a feedback connection connecting said output signal to said phase detector; and
b) an access port for connecting said output signal to said measurement device.

7. A system as described in claim 6, wherein:
a) said first fast-loop-path integrator and said second fast-loop-path integrator provide a positive phase margin at unity gain for said fast-loop signal path; and
b) said first slow-loop-path integrator and said second slow-loop-path integrator provide a positive phase margin at unity gain for said slow-loop signal path.

8. A system as described in claim 6, wherein said measurement device is an oscilloscope.

9. A system as described in claim 6, wherein said input reference signal is a clock signal comprising a jitter component and a wander component.

10. A system as described in claim 6, wherein:
a) said fast-loop-path voltage-controlled oscillator comprises a wide-range voltage-controlled oscillator; and
b) said slow-loop-path voltage-controlled oscillator comprises a narrow-range voltage-controlled oscillator.

11. A system as described in claim 6, wherein:
a) said fast-loop signal path is associated with a first plurality of frequencies, wherein each frequency in said first plurality of frequencies is less than a first demarcation frequency;
b) said first fast-loop-path integrator is a first wide-bandwidth integrator;
c) said second fast-loop-path integrator is a second wide-bandwidth integrator;
d) said slow-loop signal path is associated with a second plurality of frequencies, wherein each frequency in said second plurality of frequencies is less than a second demarcation frequency;
e) said first slow-loop-path integrator is a first narrow-bandwidth integrator;
f) said second slow-loop-path integrator is a second narrow-bandwidth integrator; and
g) said first demarcation frequency is greater than said second demarcation frequency.

12. An analog phase-locked loop arrangement, said analog phase-locked loop arrangement comprising:
a) a path selector for establishing a connection between an input reference signal and a first signal path and an output signal and said first signal path when a first bandwidth parameter value is selected and for establishing a connection between said input reference signal and a second signal path and said output signal and said second signal path when a second bandwidth parameter value is selected, wherein:
i) said first signal path comprises:
 (1) a first-signal-path phase detector for providing an first-signal-path error signal representative of the difference in phase between said input reference signal and said output signal;
 (2) a first first-signal-path integrator for integrating said first-signal-path error signal, thereby producing a first-signal-path integrated signal;
 (3) a second first-signal-path integrator for integrating said first-signal-path integrated signal, thereby producing a first-signal-path error-voltage signal; and
 (4) a first-signal-path voltage-controlled oscillator responsive to said first-signal-path error-voltage signal, thereby producing a first-signal-path output signal; and ii) said second signal path comprises:
  (1) a second-signal-path phase detector for providing an second-signal-path error signal representative of the difference in phase between said input reference signal and said output signal;
  (2) a first second-signal-path integrator for integrating said second-signal-path error signal, thereby producing a second-signal-path integrated signal;
  (3) a second second-signal-path integrator for integrating said second-signal-path integrated signal, thereby producing a second-signal-path error-voltage signal; and
  (4) a second-signal-path voltage-controlled oscillator responsive to said second-signal-path error-voltage signal, thereby producing a second-signal-path output signal;
b) an output selector for selecting said first-signal-path output signal as said output signal when said first bandwidth parameter value is selected and for selecting said second-signal-path output signal as said output signal when said second bandwidth parameter value is selected; and
c) a feedback connection connecting said output signal to said path selector.

13. An analog phase-locked loop arrangement as described in claim 12, wherein said input reference signal is a clock signal comprising a jitter component and a wander component.

14. An analog phase-locked loop arrangement as described in claim 12, wherein:
  a) said first-signal-path voltage-controlled oscillator comprises a wide-range voltage-controlled oscillator; and
  b) said second-signal-path voltage-controlled oscillator comprises a narrow-range voltage-controlled oscillator.

15. An analog phase-locked loop arrangement as described in claim 12, wherein:
  a) said first signal path is associated with a first plurality of frequencies, wherein each frequency in said first plurality of frequencies is less than a first demarcation frequency; and
  b) said second signal path is associated with a second plurality of frequencies, wherein each frequency in said second plurality of frequencies is less than a second demarcation frequency.

16. An analog phase-locked loop arrangement as described in claim 12, wherein:
  a) said first first-signal-path integrator and said second first-signal-path integrator provide a positive phase margin at unity gain for said first signal path; and
  b) said first second-signal-path integrator and said second second-signal-path integrator provide a positive phase margin at unity gain for said second signal path.

* * * * *